(12) United States Patent
Steffler

(10) Patent No.: US 7,875,812 B2
(45) Date of Patent: Jan. 25, 2011

(54) METHOD AND APPARATUS FOR ELECTRICAL COMPONENT PHYSICAL PROTECTION

(75) Inventor: Joseph B. Steffler, Alto, MI (US)

(73) Assignee: GE Aviation Systems, LLC, Grand Rapids, MI (US)

( * ) Notice: Subject to any disclaimer, the term of this patent is extended or adjusted under 35 U.S.C. 154(b) by 96 days.

(21) Appl. No.: 12/183,260

(22) Filed: Jul. 31, 2008

(65) Prior Publication Data
US 2010/0025101 A1 Feb. 4, 2010

(51) Int. Cl.
H05K 7/02 (2006.01)
H01L 23/16 (2006.01)
H01L 23/58 (2006.01)

(52) U.S. Cl. ................ 174/541; 174/564; 257/683

(58) Field of Classification Search ........... 174/520, 174/541, 564; 257/683
See application file for complete search history.

(56) References Cited

U.S. PATENT DOCUMENTS

| | | | |
|---|---|---|---|
| 4,443,656 A | | 4/1984 | Linse |
| 4,694,119 A | | 9/1987 | Groenewegen |
| 5,001,299 A | * | 3/1991 | Hingorany ............ 174/521 |
| 5,115,912 A | | 5/1992 | Murphy |
| 5,334,799 A | | 8/1994 | Naito et al. |
| 5,365,108 A | * | 11/1994 | Anderson et al. ......... 257/678 |
| 5,907,125 A | | 5/1999 | Buekers et al. |
| 6,667,076 B2 | | 12/2003 | Fried et al. |
| 7,145,430 B2 | | 12/2006 | Peinsipp et al. |
| 7,318,170 B2 | | 1/2008 | Makela et al. |
| 2002/0145196 A1 | * | 10/2002 | Wang ....................... 257/730 |
| 2006/0012016 A1 | * | 1/2006 | Betz et al. ................. 257/678 |
| 2007/0236859 A1 | | 10/2007 | Borland et al. |
| 2007/0291440 A1 | | 12/2007 | Dueber et al. |
| 2008/0185173 A1 | | 8/2008 | Bedinger et al. |

FOREIGN PATENT DOCUMENTS

WO 8300715 A1 3/1983

OTHER PUBLICATIONS

A European Search Report for co-pending application No. EP 09166171 (6 pages).

* cited by examiner

*Primary Examiner*—Hung V Ngo
(74) *Attorney, Agent, or Firm*—William Scott Andes, Esq.; Armstrong Teasdale LLP

(57) ABSTRACT

A method and apparatus for protecting a heat sensitive component from high temperature, mechanical shock and moisture are provided. An enclosure includes an outer housing surrounding an inner cavity configured to receive a heat sensitive component therein, a cover configured to matingly engage the outer housing such that the inner cavity is sealed from an environment external to the enclosure, wherein at least one of the outer housing and the cover are formed from a ceramic material.

11 Claims, 2 Drawing Sheets

METHOD AND APPARATUS FOR ELECTRICAL COMPONENT PHYSICAL PROTECTION

BACKGROUND OF THE INVENTION

This invention relates generally to protective enclosures for electronic components and, more particularly, to a method and apparatus for protecting data recording equipment from the effects of vehicle crashes.

At least some known crash-protected memory (CPM) armor for flight data recorders (FDR) utilize a metal composition, for example, but not limited to steel, titanium, and alloys to provide protection to an insulation and a memory assembly during penetration and crush events such as vehicle crashes. However, metals are generally relatively heavy and offer only limited protection in a fire due to their relatively high heat conductivity. In addition, metal compositions have a thermal coefficient of expansion that is significantly different than that of insulating materials typically found in solid state CPMs. Having significantly different thermal coefficient of expansion between a metal armor enclosure and the insulation material could cause a gap between the enclosure and the insulation material during a fire event. Such gaps may interfere with the insulation materials ability to protect the memory components within the CPM armor.

BRIEF DESCRIPTION OF THE INVENTION

In one embodiment an enclosure for protecting a heat sensitive component from high temperature, mechanical shock and moisture includes an outer housing surrounding an inner cavity configured to receive a heat sensitive component therein, a cover configured to matingly engage the outer housing such that the inner cavity is sealed from an environment external to the enclosure, wherein at least one of the outer housing and the cover are formed from a ceramic material.

In another embodiment a method of crash protecting a component includes forming a housing of a first ceramic material, the housing including a cavity configured to receive a component, forming a cover of a second ceramic material, the cover configured to matingly engage the housing such that the cavity is sealedly surrounded by ceramic material, positioning the component within the cavity, and joining the housing and the cover such that a mating engagement of the housing and the cover seals the cavity from an environment external to the housing and the cover.

In yet another embodiment a crash survivable enclosure for vehicles includes a ceramic housing forming a cavity wherein the housing includes a seal edge at least partially circumscribing the cavity. The enclosure further includes a ceramic cover including an edge complementary to the seal edge, when assembled the housing and the cover form a fire resistant enclosure surrounding the cavity.

BRIEF DESCRIPTION OF THE DRAWINGS

FIG. 1 is a perspective view of a crash survivable enclosure in accordance with an exemplary embodiment of the present invention; and FIG. 2 is a flow diagram of an exemplary method of method of crash protecting a component in accordance with an embodiment of the present invention.

DETAILED DESCRIPTION OF THE INVENTION

The following detailed description illustrates embodiments of the invention by way of example and not by way of limitation. It is contemplated that the invention has general application to methods and apparatus for protecting components from harsh environments in industrial, commercial, and residential applications.

As used herein, an element or step recited in the singular and proceeded with the word "a" or "an" should be understood as not excluding plural elements or steps, unless such exclusion is explicitly recited. Furthermore, references to "one embodiment" of the present invention are not intended to be interpreted as excluding the existence of additional embodiments that also incorporate the recited features.

Figure 1:
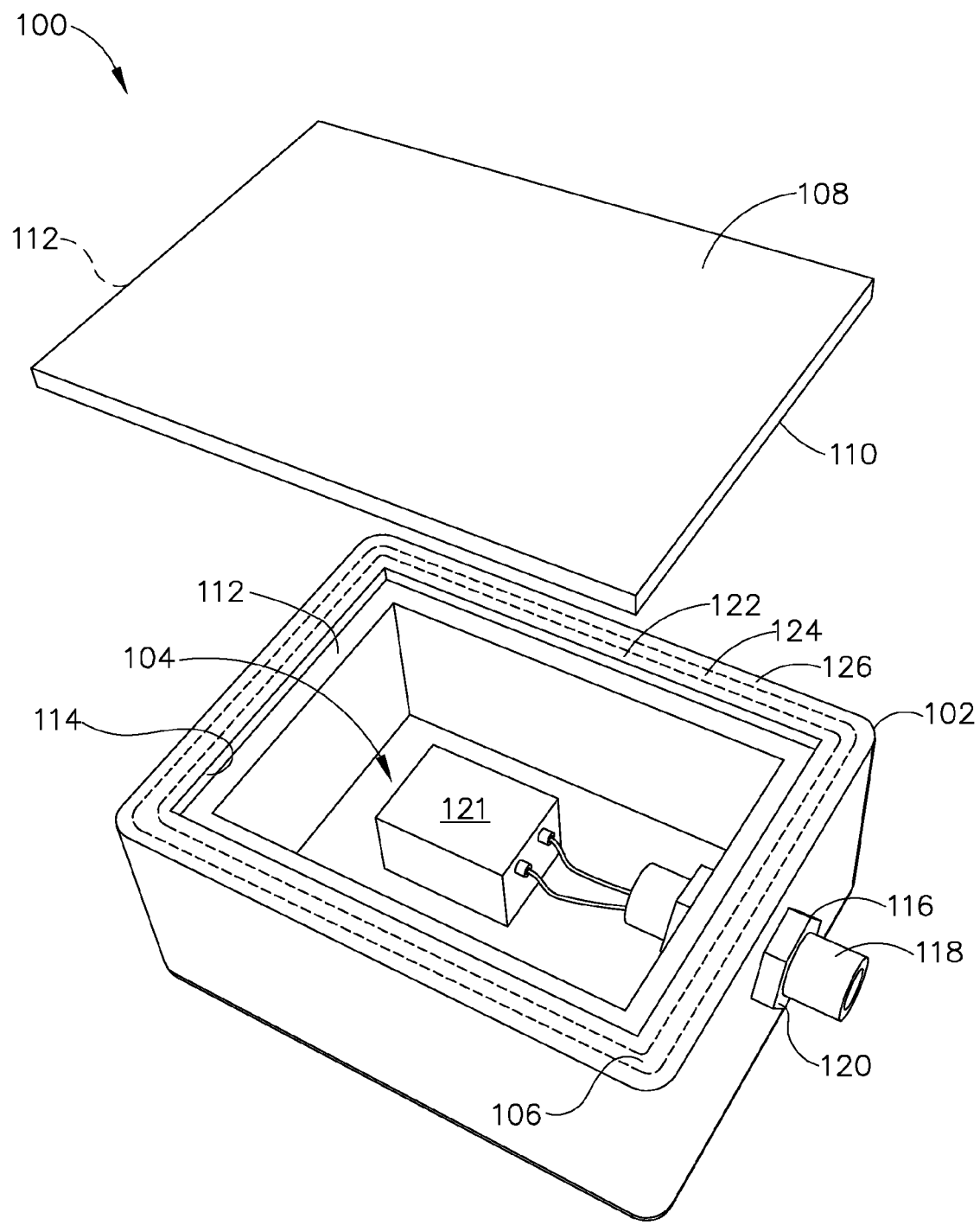
FIGS. 1-2 show exemplary embodiments of the method and apparatus described herein.

FIG. 1 is a perspective view of a crash survivable enclosure 100 in accordance with an exemplary embodiment of the present invention. In the exemplary embodiment, enclosure 100 is configured to be carried on board a vehicle and to protect a component such as but not limited to a solid state memory for, for example, a flight data recorder. It is anticipated that enclosure 100 would be used in a vehicle such as an aircraft or spacecraft that during a crash could subject enclosure 100 to extremes of fire and shock. Enclosure 100 includes a ceramic housing 102 forming a cavity 104. Housing 102 includes a seal edge 106 that at least partially circumscribes cavity 104. Enclosure 100 further includes a ceramic cover 108 that includes an edge 110 that is complementary to seal edge 106. When assembled, housing 102 and cover 108 form a fire resistant enclosure surrounding cavity 104.

Enclosure 100 further includes a thermal insulation layer 112 surrounding cavity 104 and adjacent to an inner surface 114 of housing 102 and cover 108. In the exemplary embodiment, a coefficient of thermal expansion of thermal insulation layer 112 is selected to be approximately equal to a coefficient of thermal expansion of at least one of housing 102 and cover 108. Typically, housing 102 and cover 108 are formed of similar material having approximately equal coefficients of thermal expansion. In an alternative embodiment, housing 102 and cover 108 are formed of material having different coefficients of thermal expansion. Differential expansion between housing 102, cover 108, and thermal insulation layer 112 may cause gaps between housing 102, cover 108, and thermal insulation layer 112. In an alternative embodiment, thermal insulation layer 112 is spaced apart from housing 102 and/or cover 108 such that a gap between housing 102 and/or cover 108 and thermal insulation layer 112 is desirable.

In the exemplary embodiment, housing 102 and/or cover 108 are formed of a boron carbide matrix. The boron carbide ceramic may be cast to form housing 102 and/or cover 108 and may include various amounts of binder during a forming process. Additionally, boron carbide may be mixed with a plasticizer to facilitate reducing a brittleness or increasing a fracture toughness of the formed and cured housing 102 and/or cover 108. In various alternative embodiments, the boron carbide ceramic is melt spun to form ceramic fibers which are formed into housing 102 and/or cover 108. In an alternative embodiment, ceramic material is formed of a plurality of layers 122, 124, and 126. In various embodiments, layers 122, 124, and 126 comprise various materials formed and/or adhered together to form workable sheets or may be formed in nestable shapes such that one layer fits within another layer which then fits into another layer and so on. The various nested shapes may then be bonded or coupled together to form housing 102 and/or cover 108. For example, one layer of the plurality of layers 122, 124, and 126 may comprise a metal, another layer may comprise a first ceramic material having a first composition, and still another layer may comprise a second ceramic material having a second composition. The order of layers 122, 124, and 126 is selected based on an anticipated service of enclosure 100 such as the type of vehicle in which enclosure 100 will be deployed. The order of layers 122, 124, and 126 may also be selected based on a level of penetration resistance desired, or an anticipated fire temperature and duration of exposure.

Enclosure 100 further includes an electrical connector 116 that passes through enclosure 100 into cavity 104 through housing 102 and/or cover 108 such that a seal between cavity 104 and the environment external to housing 102 and cover 108 is maintained. Electrical connector 116 includes power terminals 118 and data terminals 120 configured to conduct power and data signals respectively to a component 121 positioned within cavity 104. In the exemplary embodiment, component 121 is a memory of a data recorder. In various other embodiments, component 121 may include another electronic component such as a processor or an article that is heat, shock, and/or moisture sensitive.

In various embodiments, a thickness of ceramic enclosure 100 is greater than a thickness of an equivalent metal enclosure, however due to the weight of ceramic material being approximately 70% lighter than the weight of metal an overall weight reduction using the ceramic material can be realized. Additionally, ceramic material exhibits a lesser heat conductivity than metal thus providing an additional thermal insulating advantage over metal formed enclosures.

Figure 2:
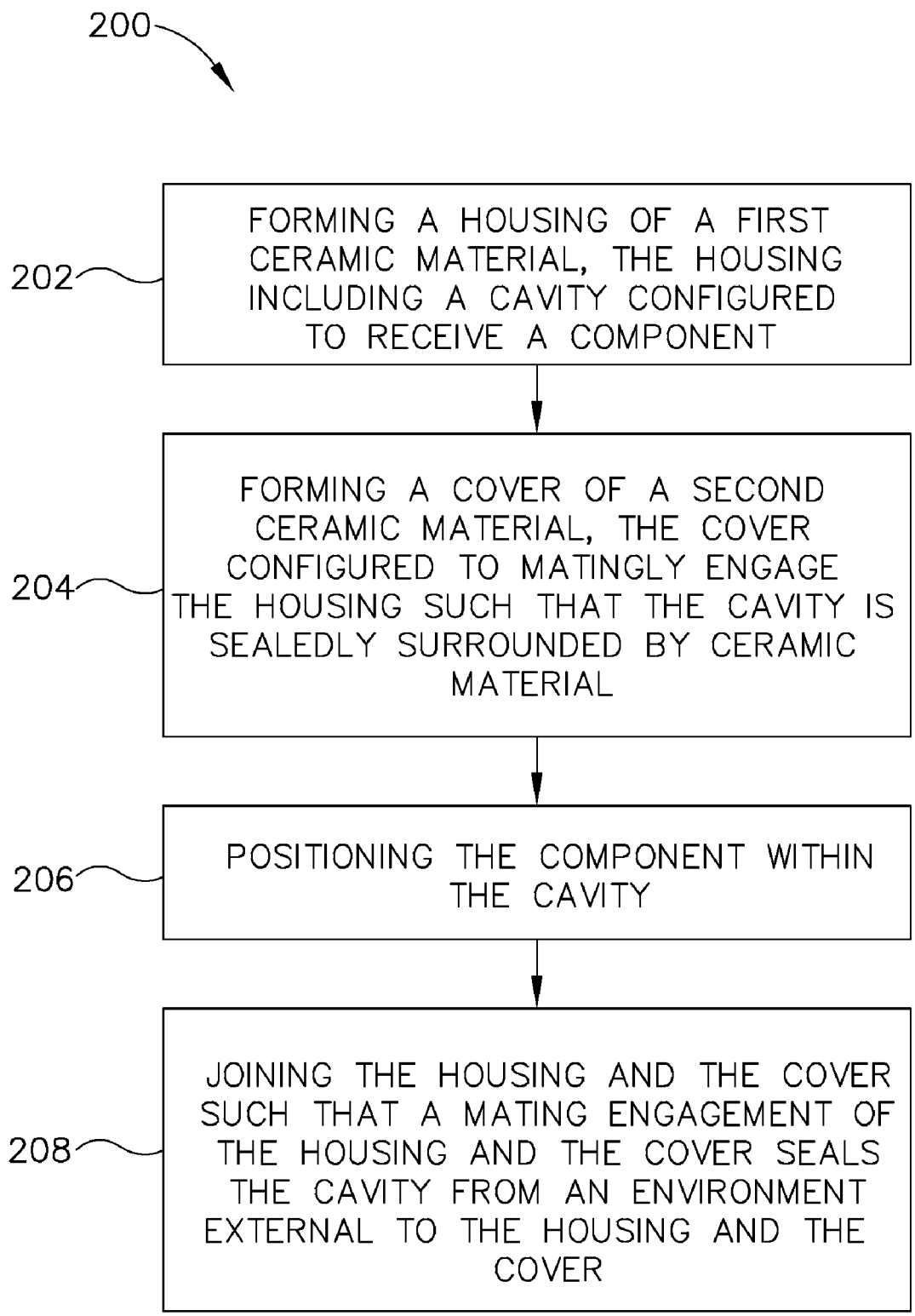

FIG. 2 is a flow diagram of an exemplary method 200 of method of crash protecting a component in accordance with an embodiment of the present invention. In the exemplary embodiment, method 200 includes forming 202 a housing of a first ceramic material wherein the housing includes a cavity configured to receive a component and forming 204 a cover of a second ceramic material wherein the cover is configured to matingly engage the housing such that the cavity is sealedly surrounded by ceramic material. Method 200 also includes positioning 206 the component within the cavity and joining 208 the housing and the cover such that a mating engagement of the housing and the cover seals the cavity from an environment external to the housing and the cover.

The term processor, as used herein, refers to central processing units, microprocessors, microcontrollers, reduced instruction set circuits (RISC), application specific integrated circuits (ASIC), logic circuits, and any other circuit or processor capable of executing the functions described herein.

As used herein, the term memory may include RAM memory, ROM memory, EPROM memory, EEPROM memory, and non-volatile RAM (NVRAM) memory. The above memory types are exemplary only, and are thus not limiting as to the types of memory usable within enclosure 100.

The above-described embodiments of a method and apparatus for crash protecting a component provides a cost-effective and reliable means for protecting a heat sensitive component from high temperature, shock, and moisture. More specifically, the methods and apparatus described herein facilitate reducing a weight of for example, an enclosure that crash protects the component. In addition, the above-described methods and apparatus facilitate isolating the component from an ambient environment during and after a crash where an adverse environment of mechanical shock, fire, and/or moisture can damage the component. As a result, the methods and apparatus described herein facilitate protecting a heat sensitive component from high temperature, shock, and moisture in a cost-effective and reliable manner.

While the disclosure has been described in terms of various specific embodiments, it will be recognized that the disclosure can be practiced with modification within the spirit and scope of the claims.

What is claimed is:

1. An enclosure for protecting a heat sensitive component from high temperature, shock and moisture, said enclosure comprising:

an outer housing surrounding an inner cavity configured to receive a heat sensitive component therein;

a thermal insulation layer surrounding said inner cavity, said thermal insulation layer comprising a material having a coefficient of thermal expansion approximately equal to a coefficient of expansion of said ceramic material; and a cover configured to matingly engage said outer housing such that said inner cavity is sealed from an environment external to said enclosure;

wherein at least one of said outer housing and said cover are formed from a ceramic material.

2. An enclosure in accordance with claim 1 wherein said ceramic material comprises a boron carbide matrix.

3. An enclosure in accordance with claim 1 wherein said ceramic material comprises a boron carbide containing ceramic formed of fibers.

4. An enclosure in accordance with claim 1 wherein said outer housing is cast of a ceramic material.

5. An enclosure in accordance with claim 1 wherein said ceramic material is formed of a plurality of layers.

6. An enclosure in accordance with claim 5 wherein said plurality of layers comprises at least one layer of metal.

7. An enclosure in accordance with claim 1 further comprising:

an aperture through at least one of said housing and said cover; and an electrical connector covering said aperture such that a seal between said inner cavity and the environment external to said enclosure is maintained, said electrical connector configured to conduct at least one of electrical power and electrical signals through at least one of said housing and said cover.

8. A crash survivable enclosure for vehicles, said enclosure comprising:

a ceramic housing forming a cavity, said housing comprising a seal edge at least partially circumscribing said cavity;

a ceramic cover comprising an edge complementary to said seal edge, when assembled said housing and said cover forming a fire resistant enclosure surrounding said cavity; and a thermal insulation layer surrounding said cavity and adjacent an inner surface of said housing and said cover, wherein a coefficient of thermal expansion of said thermal insulation layer is approximately equal to a coefficient of thermal expansion of at least one of said housing and said cover.

9. An enclosure in accordance with claim 8 wherein at least one of said ceramic housing and said ceramic cover comprise a boron carbide matrix.

10. An enclosure in accordance with claim 8 further comprising an electrical connector passing into said cavity through the least one of the housing and the cover such that a seal between the cavity and the environment external to the housing and the cover is maintained.

11. An enclosure in accordance with claim 10 wherein said electrical connector comprises at least one of power terminals and data terminals configured to conduct power and data signals respectively to the component.

* * * * *